US010644653B2

(12) United States Patent
Itabashi

(10) Patent No.: US 10,644,653 B2
(45) Date of Patent: May 5, 2020

(54) AMPLIFIER AND OPTICAL TRANSMITTER USING THE SAME

(71) Applicant: SUMITOMO ELECTRIC INDUSTRIES, LTD., Osaka (JP)

(72) Inventor: Naoki Itabashi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 281 days.

(21) Appl. No.: 15/808,014

(22) Filed: Nov. 9, 2017

(65) Prior Publication Data
US 2018/0131330 A1   May 10, 2018

(30) Foreign Application Priority Data

Nov. 10, 2016   (JP) .................................. 2016-219995

(51) Int. Cl.
*H03F 1/14* (2006.01)
*H03F 3/68* (2006.01)
(Continued)

(52) U.S. Cl.
CPC ............... *H03F 1/14* (2013.01); *H01F 27/29* (2013.01); *H03F 3/245* (2013.01); *H03F 3/45475* (2013.01); *H03F 3/45928* (2013.01); *H03F 3/54* (2013.01); *H03F 3/68* (2013.01); *H04B 10/502* (2013.01); *H04B 10/504* (2013.01); *H05K 1/025* (2013.01); *H05K 1/111* (2013.01); *H05K 1/181* (2013.01); *H01F 2005/006* (2013.01);
(Continued)

(58) Field of Classification Search
USPC .................................................. 330/275–276
See application file for complete search history.

(56) References Cited

U.S. PATENT DOCUMENTS 6,639,461 B1   10/2003   Tam et al.
2011/0103267 A1*   5/2011   Devuyst ................. H04B 3/548
370/276
(Continued)

FOREIGN PATENT DOCUMENTS

JP   S54-177853   5/1978
JP   H2-54603   2/1990
(Continued)

OTHER PUBLICATIONS

Japanese Office Action dated Mar. 10, 2020 for Japanese Application No. 2016-219995 with an English Translation.

*Primary Examiner* — Danny Nguyen
(74) *Attorney, Agent, or Firm* — Smith, Gambrell & Russell, LLP.

(57) ABSTRACT

An amplifier includes a printed circuit board that includes an output terminal for outputting an electrical signal to an outside and a bias terminal for receiving a bias of the electrical signal from the outside, and an integrated circuit, a capacitor, an inductor, and a ferrite bead element mounted on the printed circuit board. The integrated circuit includes a driving circuit and an output end, and outputs the electrical signal generated by the driving circuit from the output end. The capacitor is connected between the output end and the output terminal. A series circuit includes the inductor and the ferrite bead element connected to each other in series, with the inductor connected to the output end, and the ferrite bead element connected to the bias terminal.

7 Claims, 15 Drawing Sheets

(51) Int. Cl.

| | |
|---|---|
| *H03F 3/45* | (2006.01) |
| *H03F 3/24* | (2006.01) |
| *H05K 1/02* | (2006.01) |
| *H04B 10/50* | (2013.01) |
| *H01F 27/29* | (2006.01) |
| *H03F 3/54* | (2006.01) |
| *H05K 1/11* | (2006.01) |
| *H05K 1/18* | (2006.01) |
| *H01F 5/00* | (2006.01) |
| *H03L 7/08* | (2006.01) |

(52) U.S. Cl.
CPC .... *H03F 2200/391* (2013.01); *H03F 2200/42* (2013.01); *H03L 7/0807* (2013.01); *H04B 10/50* (2013.01); *H05K 1/0245* (2013.01); *H05K 2201/1003* (2013.01); *H05K 2201/10015* (2013.01); *H05K 2201/10287* (2013.01); *H05K 2201/10522* (2013.01); *H05K 2201/10636* (2013.01); *Y02P 70/611* (2015.11)

(56) References Cited

U.S. PATENT DOCUMENTS

| | | | |
|---|---|---|---|
| 2013/0229699 A1 | 9/2013 | Tatsumi et al. | |
| 2015/0035607 A1* | 2/2015 | Takenaka | H03F 3/21 |
| | | | 330/297 |

FOREIGN PATENT DOCUMENTS

| | | |
|---|---|---|
| JP | H7-183766 | 7/1995 |
| JP | 2007-109839 | 4/2007 |
| JP | 2013-183450 | 9/2013 |

* cited by examiner

AMPLIFIER AND OPTICAL TRANSMITTER USING THE SAME

BACKGROUND OF THE INVENTION

Field of the Invention

One aspect of the present invention relates to an amplifier and an optical transmitter using the amplifier.

Related Background Art

In an optical transmitter, a driving circuit that drives an optical device for transmitting an optical signal, and a bias circuit that supplies a bias voltage to the driving circuit, are mounted on a printed circuit board.

A packaged winding coil is used for the bias circuit. A parasitic capacitor of the driving circuit and an inductor of the packaged winding coil cause resonance phenomena harmful to the optical signal. Such resonance phenomena should be prevented.

SUMMARY

According to an aspect of the present invention, there is provided an amplifier including: a printed circuit board (PCB) having a component side and a solder side and including an output terminal and a bias terminal, the output terminal being configured to output an electrical signal to an outside, the bias terminal being configured to receive a bias of the electrical signal from the outside; an integrated circuit (IC) mounted on the component side of the PCB, including a driving circuit and an output end, the driving circuit being configured to generate the electrical signal, the output end being configured to output the electrical signal generated by the driving circuit; a capacitor mounted on the component side of the PCB and electrically connected between the output end of the IC and the output terminal of the PCB; and a series circuit mounted on the component side of the PCB, including an inductor and a ferrite bead element connected to each other in series, the inductor having a first end and a second end, a ferrite bead element having a first end and a second end, the first end of the inductor being electrically coupled to the output end of the IC, the second end of the ferrite bead element being electrically coupled to the bias terminal of the PCB, the second end of the inductor being electrically coupled to the first end of the ferrite bead element.

According to another aspect of the present invention, there is provided an amplifier including: a printed circuit board (PCB) including a plurality of output terminals and a plurality of bias terminals; an integrated circuit (IC) mounted on the PCB, the IC including a plurality of output ends; a plurality of capacitors mounted on the PCB and each connected between each output ends and each output terminals; a plurality of series circuits mounted on the PCB, each series circuit including a first inductor and a ferrite bead element connected to each other in series, each first inductor being electrically coupled to each output end, and each ferrite bead element being electrically connected to each bias terminal, and a plurality of second inductors each having a first end and a second end, each first end of the second inductors being electrically connected to each output terminal, each second end of the second inductors being commonly connected to a bias voltage.

DESCRIPTION OF THE PREFERRED EMBODIMENTS

Figure 1:
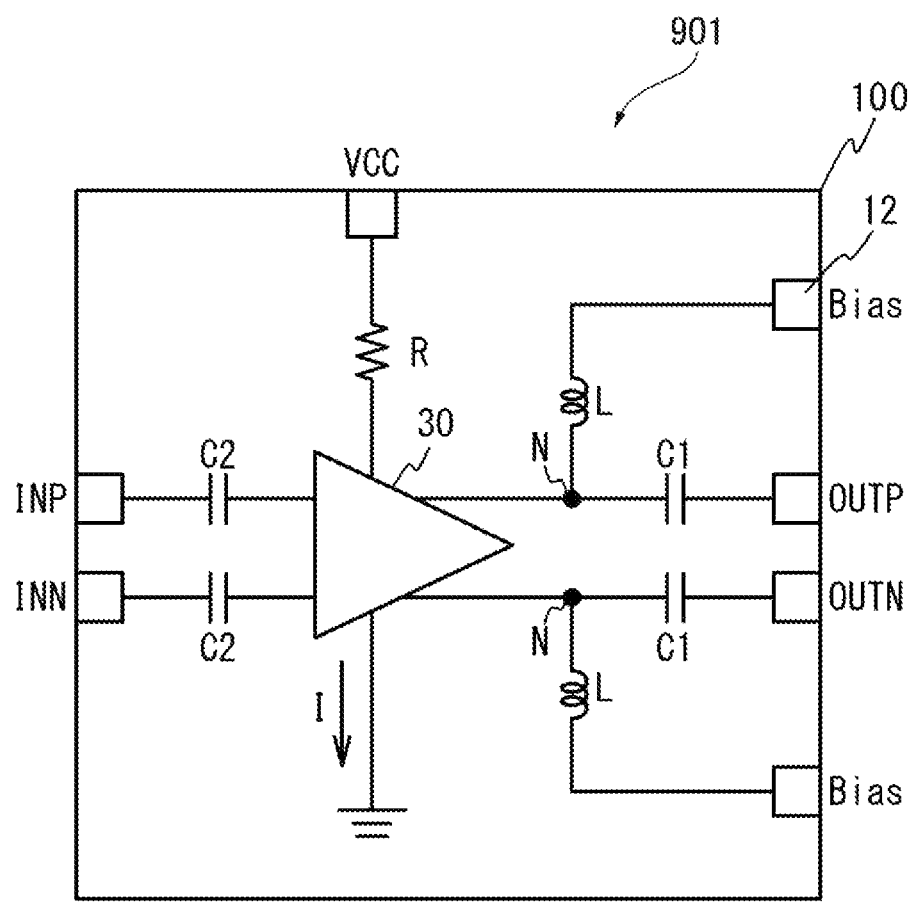
FIG. 1 is a circuit diagram of an amplifier according to a comparative example 1.

Hereinafter, embodiments of an amplifier and an optical transmitter according to the present invention will be described in detail with reference to the accompanying drawings. In the description of the drawings, the same elements are denoted by the same reference numerals, and repeated descriptions are omitted.

Figure 6:
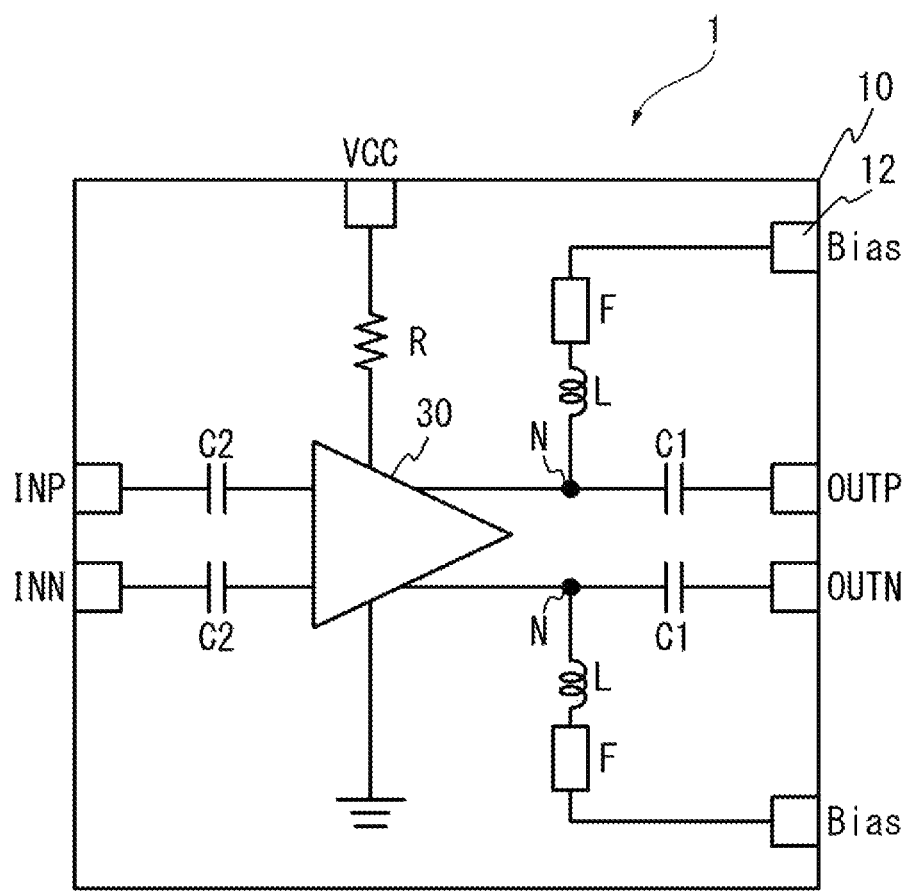
FIG. 6 is a circuit diagram of the amplifier according to a first embodiment.

FIG. 6 is a circuit diagram of an amplifier 1 according to a first embodiment of the present invention. FIG. 6 illustrates that the amplifier 1 according to the first embodiment of the present invention is formed on a printed circuit board 10. The amplifier 1 is used in an optical transmitter for driving, for example, a laser diode, an optical modulator, or the like.

The amplifier 1 formed on the printed circuit board 10 includes differential input terminals INP and INN, differential output terminals OUTP and OUTN, and a driving circuit 30. The differential input terminals INP and INN receive a differential input signal from the outside. The differential input signal includes a positive phase component and a negative phase component which have phases different from each other by 180 degrees. The positive phase component has amplitude substantially equal to amplitude of the negative phase component. For example, when the positive phase component increases, the negative phase component decreases, and vice versa. When the positive phase component reaches the maximum voltage (peak level) thereof, the negative phase component reaches the minimum voltage (bottom level) thereof, and vice versa. Difference in voltage between the positive phase component and the negative phase component is equal to amplitude in voltage of the differential input signal. The positive phase component is input to the terminal INP, and the negative phase component is input to the terminal INN. The driving circuit 30 is a differential amplifier circuit for amplifying the differential input signal. The driving circuit 30 may include, for example, a traveling-wave amplifier circuit. The driving circuit 30 amplifies the differential input signal which is input to the differential input terminals INP and INN, and outputs the amplified differential input signal as a differential output signal to the differential output terminals OUTP and OUTN. The differential output terminals OUTP and OUTN output the differential output signal (high frequency signal) to the outside. The differential output signal includes a positive phase component and a negative phase component which have phases different from each other by 180 degrees. The positive phase component of the differential output signal has amplitude equal to amplitude of the negative phase component of the differential output signal. For example, when the positive phase component of the differential output signal increases, the negative phase component of the differential output signal decreases, and vice versa. When the positive phase component of the differential output signal reaches the maximum voltage (peak level) thereof, the negative phase component of the differential output signal reaches the minimum voltage (bottom level) thereof, and vice versa. Difference in voltage between the positive phase component and the negative phase component of the differential output signal is equal to amplitude in voltage of the differential output signal. The positive phase component of the differential output signal is output from the terminal OUTP, and the negative phase component of the differential output signal is output from the terminal OUTN. Thus, the differential output terminals OUTP and OUTN output the differential output signal. The differential output terminals OUTP and OUTN are electrically connected, for example, to an optical device such as a laser diode or an optical modulator. The differential output signal is used for driving, for example, an optical device such as a laser diode, an optical modulator, or the like. In the amplifier 1 according to the embodiment of the present invention, in order to independently set a reference voltage (bias voltage) of the differential output signal of the driving circuit 30 and a reference voltage of inputs of the optical device, capacitors C1 are provided between outputs of the driving circuit 30 and the differential output terminals OUTP and OUTN. The capacitors C1 block a DC component and pass high frequency components through. That is, each of the two outputs of the driving circuit 30 and each of the two differential output terminals OUTP and OUTN are electrically connected to each other via the respective capacitors C1. Capacitors C2 are provided between the differential input terminals INP and INN and the two inputs of the driving circuit 30. That is, each of the two differential input terminals INP and INN and each of the two inputs of the driving circuit 30 are electrically connected to each other via the respective capacitors C2.

The capacitors C1 and C2 allow high frequency components of the signal to pass therethrough and they block a direct current (DC) component of the signal. The amplifier 1 formed on the printed circuit board 10 further includes bias terminals Bias, ferrite beads F and inductors L. Each of the bias terminals Bias receives a bias voltage from the outside. Each bias terminal Bias is electrically connected to each output of the driving circuit 30 via a series circuit configured with the ferrite bead F and the inductor L. More specifically, one end of the inductor L is electrically connected to a connection node (output node) N between the output of the driving circuit 30 and the capacitor C1, and the other end of the inductor L is electrically connected to one end of the ferrite bead F. The other end of the ferrite bead F is electrically connected to the bias terminal Bias. The bias voltage provided from the outside to the bias terminal Bias passes through the ferrite bead F, passes through the inductor L, and is supplied to the driving circuit 30. The inductor L is, for example, an inductor with a winding coil. When noise is mixed in the bias voltage supplied from the outside, the reference voltage of the differential output signals output from the driving circuit 30 fluctuates due to the noise and thus the waveform quality of the differential output signals deteriorates. Therefore, the ferrite bead F and the inductor L eliminates the noise from the bias voltage supplied to the driving circuit 30, thereby improving the waveform quality of the differential output signal. The driving circuit 30 is connected to a power supply terminal VCC and a ground. Electric power is supplied from an external power supply to the driving circuit 30 via the power supply terminal VCC, and the driving circuit 30 amplifies the differential input signal. Specifically, a power supply line of the driving circuit 30 is electrically connected to the power supply terminal VCC via a resistor R. A ground line of the driving circuit 30 is connected, for example, to a ground pattern of the printed circuit board 10. The differential input terminals INP and INN, the differential output terminals OUTP and OUTN, and the bias terminals Bias may be respectively configured by terminals 12 provided on the printed circuit board 10. The differential input terminals, the differential output terminals, the power supply terminal, and the like may be arranged to positions thereof suitable for electrically connecting the driving circuit 30 formed on the printed circuit board 10 to an external device.

The capacitor C1 and the series circuit configured with the ferrite bead F and the inductor L constitute a T-type bias circuit (Bias T), which includes no resistive element that consumes electric power. Therefore, the bias T can reduce power consumption as compared with a case where the resistance R of the amplifier 1 is used for generating the reference voltage. For example, in a case where an output current (circuit current) I flows into the output of the driving circuit 30 and thus the circuit current I flows through the driving circuit 30 to the ground, the circuit current I includes an alternating current (AC) component and a direct current (DC) component. In a case where a bias voltage is not supplied through the series circuit configured with the ferrite bead F and the inductor L, for example, supplying the DC current to the resistor R may generate the reference voltage of the differential output signals (bias voltage). A resistance of the resistor R is, for example, 50 Ω. On the other hand, a voltage drop of the resistor R causes the reference voltage of the output of the driving circuit 30 to be lower than the power supply voltage of the power supply terminal VCC. For this reason, the amplitude of the differential output signals output from the differential output terminals OUTP and OUTN is limited to be small because of the lowered reference voltage. The power consumed by the resistor R does not contribute to amplification of the driving circuit 30, and namely becomes ineffective.

As illustrated in FIG. 6, in the bias T, for example, a resistance component (equivalent series resistance: ESR) in series with the inductor L is approximately 1 Ω. Therefore, the bias voltage applied to the output node N from the outside via the bias terminal Bias and the series circuit configured with the ferrite bead F and the inductor L prevents a DC potential (average voltage) of the output node N from falling from the bias voltage. Thus, the voltage amplitude of the differential output signals output from the differential output terminals OUTP and OUTN can be increased, as compared with the above-described method which generates the bias voltage inside the driving circuit 30 using the resistor R. Therefore, a supply voltage to obtain the voltage amplitude of the differential output signals can be reduced. In other words, most of the DC component of the circuit current I is supplied from the bias terminal Bias. Accordingly, the bias T prevents the DC component of the circuit current I from being ineffectively consumed by the resistor R.

Figure 7:
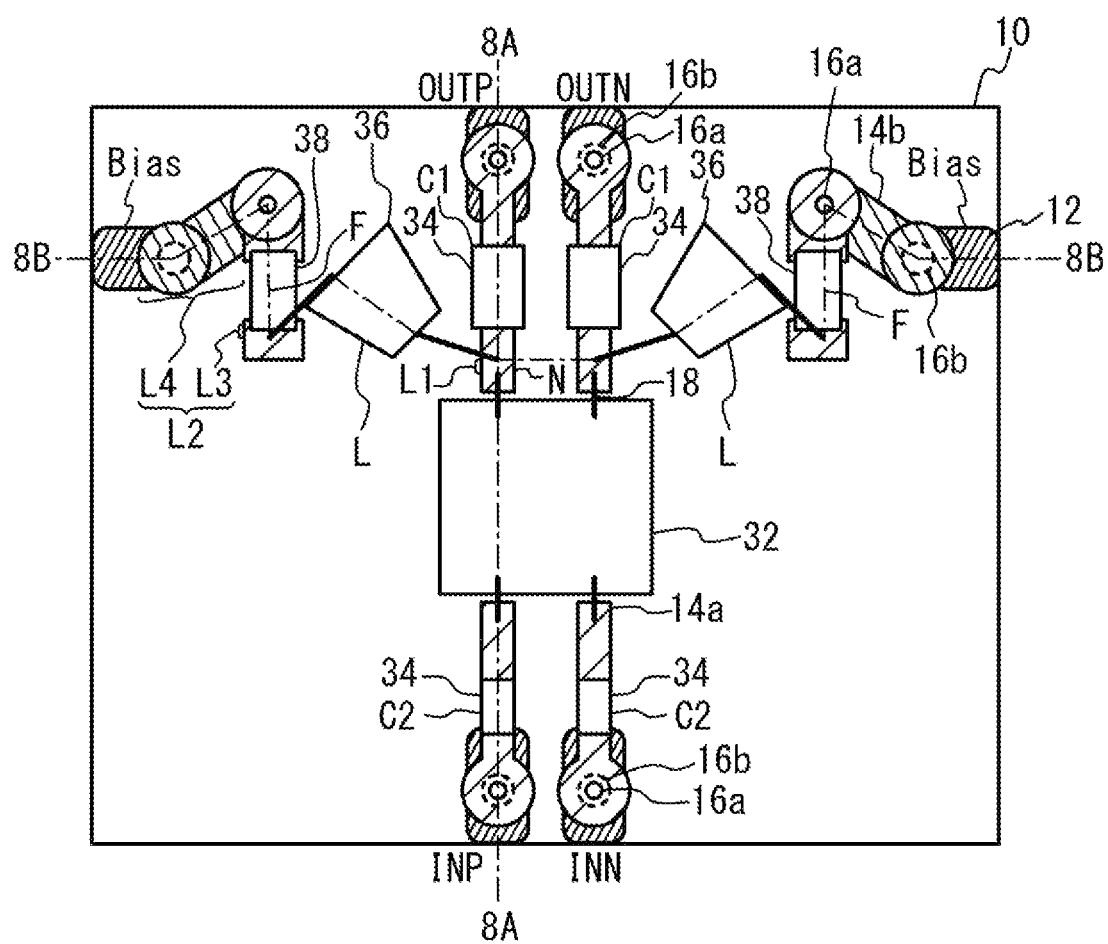
FIG. 7 is a plan view of the printed circuit board on which the amplifier according to the first embodiment is mounted.

FIG. 7 is a plan view of the printed circuit board 10 on which the amplifier 1 according to the first embodiment of the present invention is mounted. The power supply terminal VCC, the ground, and wirings electrically connected to the power supply terminal and the ground are not illustrated. As illustrated in FIG. 7, a driving circuit chip (IC) 32, chip capacitors 34, coils 36, and ferrite bead chips (ferrite bead element) 38 are mounted on the printed circuit board 10. The driving circuit chip 32 is, for example, an integrated circuit (IC) formed on a semiconductor chip, and corresponds to the driving circuit 30 of FIG. 6. The driving circuit chip 32 is, for example, a monolithic semiconductor integrated circuit which is cut (diced) to a size of approximately 1 mm×1 mm That is, the driving circuit chip 32 includes the driving circuit 30 and a output pad, and outputs the high frequency signal (differential output signal) generated by the driving circuit 30 from the output pad. The ferrite bead chip 38 corresponds to the ferrite bead F of FIG. 6. A size of the ferrite bead chip 38 in plane (bottom) is, for example, approximately 0.6 mm×0.3 mm. The ferrite bead chip 38 and the bias terminal Bias are electrically connected to each other via a through electrode 16a, an internal wiring 14b, and a through electrode 16b.

More specifically, a surface wiring (first conductive layer) 14a is provided on an top surface (component side) of the printed circuit board 10, the internal wiring (second conductive layer) 14b is provided in the inside (inner layers) of the printed circuit board 10, and the terminal 12 is provided on a lower surface (solder side) of the printed circuit board 10. The through electrode 16a electrically connects the surface wiring 14a with the internal wiring 14b. The through electrode 16b electrically connects the internal wiring 14b with the terminal 12. Wire 18 is a bonding wire or a lead of the coil 36. The bonding wire electrically connects the surface wiring 14a with the chip 32. The lead electrically connects the surface wiring 14a to the coil 36. In other words, the chip 32, one end (first end) of the chip capacitor 34, and one end (first end) of the coil 36 are electrically coupled to each other via the surface wiring 14a and the wires 18. The other end (second end) of the coil 36 is electrically coupled to one end (first end) of the ferrite bead 38. The other end (second end) of the coil 36 and one end (first end) of the ferrite bead 38 may be directly connected to each other or may be connected to each other via another surface wiring 14a. The other end (second end) of the ferrite bead 38 is electrically coupled to the terminal 12 (bias terminal Bias) via the through electrode 16a, the internal wiring 14b, and the through electrode 16b. The internal wiring (second conductive layer) 14b may include the through electrode 16a at the one end (first end) thereof and other end of thereof.

The coil 36 in the bias T has equivalent series resistance (ESR) and impedance (inductance) of an inductor. Preferably, a value of the ESR is small and a values of the impedance is sufficiently high for the fundamental frequency of the high frequency signal. For example, a conical coil is used as such a coil having a high impedance even at a frequency of 20 GHz or more.

Figure 3:
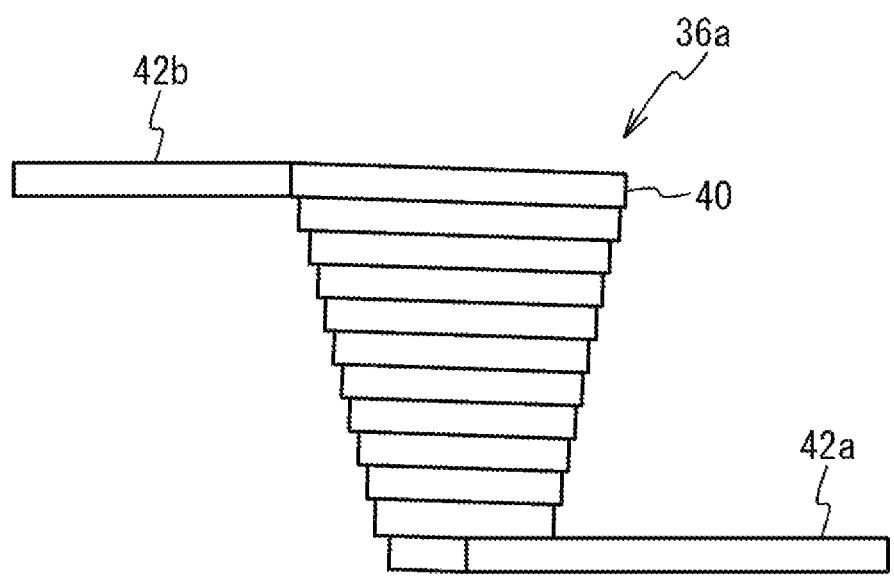
FIG. 3 is a side view of a conical coil.

FIG. 3 is a side view of the conical coil. As illustrated in FIG. 3, a conical coil 36a includes leads 42a and 42b, and a coil portion 40. The coil portion 40 has an electric wire wound in a conical shape. The side view illustrates a view when the conical coil 36a is viewed from a side, corresponds to a normal to a straight line orthogonal to the central axis of the conical shape of the coil portion 40. The lead 42a is connected to one end the coil portion 40. The lead 42b is connected to-the-other end of the coil portion 40. In the coil portion 40, a winding portion having a small diameter (or curvature) on the lead 42a side has a high self-resonance frequency, and a winding portion having a large diameter (or curvature) on the lead 42b side has a small self-resonance frequency. Thus, the conical coil 36a can be equivalently regarded as a coil in which a plurality of small coils each having a different self-resonance frequencies from others are connected with each other in series. Therefore, an inductance can be increased up to a high frequency and a parasitic capacitance can be decreased. As described above, preferably, the conical coil 36a is used for constituting the bias T. In the conical coil 36a, the lead 42a connected to the small-diameter portion of the conical shape of the coil portion 40 is connected to a signal line (output node N), and the lead 42b connected to the large-diameter portion of the conical shape of the coil portion 40 is connected to the bias terminal Bias side.

Returning to the description of FIG. 7, the chip capacitors 34 corresponds to the capacitors C1 and C2 of FIG. 6. The coil 36 is a winding coil, for example, a conical (circular cone-shaped) coil, and corresponds to the inductor L of FIG. 6. The differential input terminals INP and INN and the differential output terminals OUTP and OUTN will be described later.

Figure 8A:
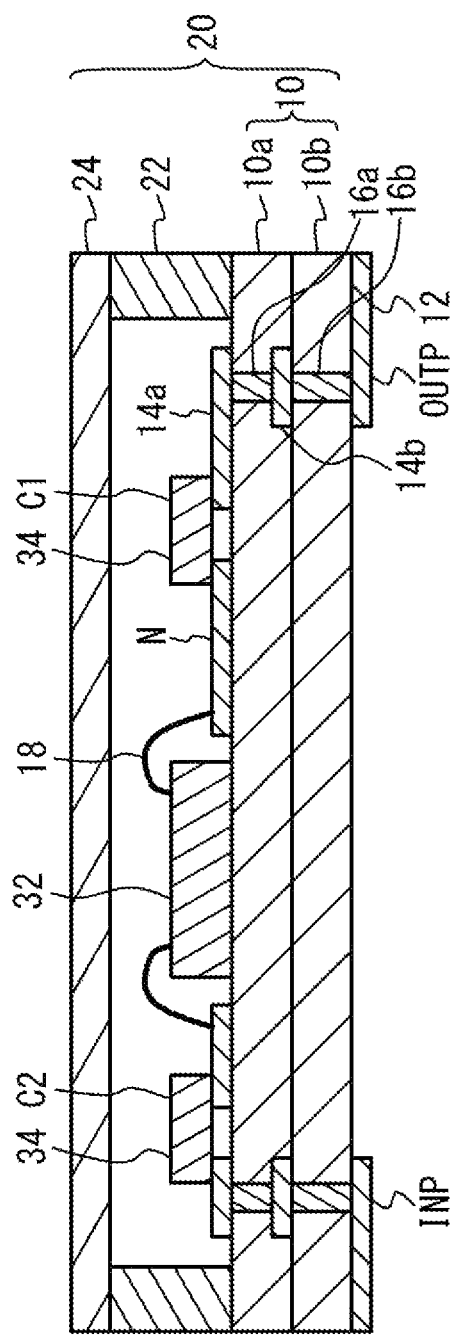
FIG. 8A is a sectional view taken along a line 8A-8A of FIG. 7.
Figure 8B:
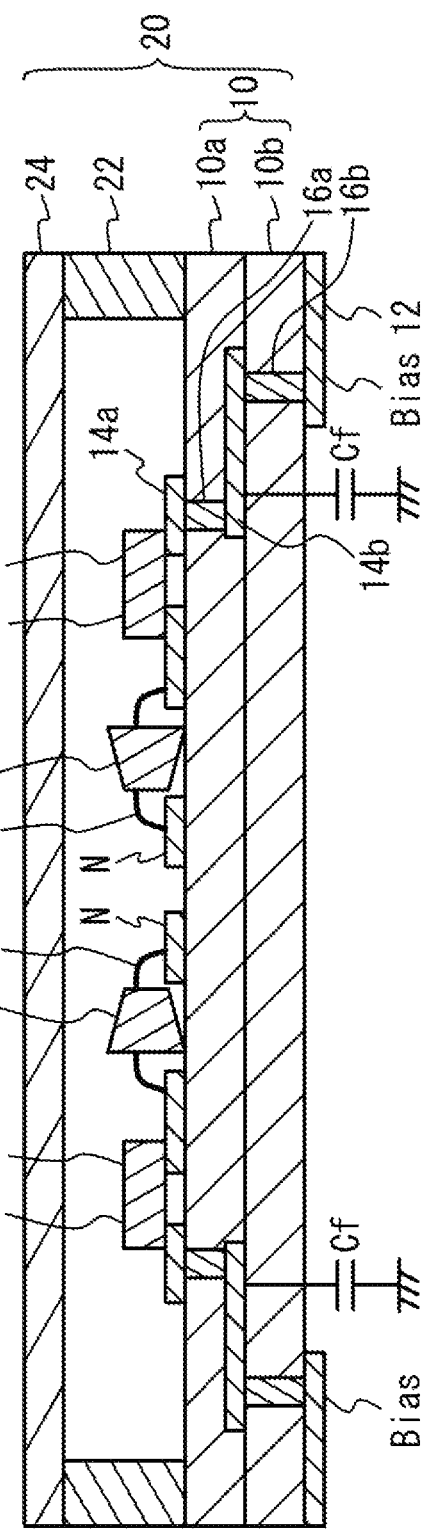
FIG. 8B is a sectional view taken along a line 8B-8B of FIG. 7.

FIG. 8A is a sectional view taken along a line 8A-8A of FIG. 7, and FIG. 8B is a sectional view taken along a line 8B-8B of FIG. 7.

As illustrated in FIGS. 8A and 8B, a package 20 includes the printed circuit board 10, a frame body 22, and a lid 24. The printed circuit board 10 includes stacked insulating layers 10a and 10b. The material forming the insulating layers 10a and 10b is dielectric, for example, a ceramic having a low dielectric constant. The insulating layers 10a and 10b may have a high dielectric constant, or may be made of resin such as glass epoxy. The terminal 12 is provided on a bottom surface of the insulating layer 10b. The bottom surface of the insulating layer 10b corresponds to the solder side of the printed circuit board 10. Disposition and shape of the terminal 12 may be in accordance with a standard package such as a quad flat package (QFP), a ball grid array (BGA), or a land grid array (LGA).

The internal wiring (second conductive layer) 14b is provided between the insulating layers 10a and 10b. The surface wiring (first conductive layer) 14a is provided on an top surface of the insulating layer 10a. The top surface of the insulating layer 10a corresponds to the component side of the printed circuit board 10. The through electrode 16a penetrates the insulating layer 10a from the top surface to bottom surface thereof. The through electrode 16b penetrates the insulating layer 10b from the top surface to bottom surface thereof. The through electrode 16a and 16b are electrically connected with each other. The terminal 12, the surface wiring 14a, the internal wiring 14b, and the through electrodes 16a and 16b are, for example, metal layers (conductive films) such as a copper layer (copper foil) or a gold layer. The frame body 22 is provided on a circumferential edge of the top surface (component side) of the printed circuit board 10. In the terminal 12, the copper layer or the metal layer is exposed without being covered by a resist so as to allow the terminal 12 to be electrically connected with an external electrode. The copper layer or the metal layer may be plated with gold. The frame body 22 is made of an insulator or a metal. The lid 24 is provided on the frame body 22. The lid 24 is made of an insulator or a metal. The chip 32 and the like are sealed (for example, hermetically sealed) by the print circuit board 10, the frame body 22 and the lid 24. For example, in a case where the frame body 22 and the lid 24 are made of a metal, a hermetic seal is performed by welding a circumferential edge of the lid 24 disposed on the frame body 22. The package 20 and the printed circuit board 10 have a plane size of, for example, several mm×several mm.

As illustrated in FIG. 8A, the driving circuit chip 32 including the driving circuit 30 and the chip capacitors 34 corresponding to the capacitors C1 and C2 are mounted on the top surface (component side) of the printed circuit board 10. One differential input terminal INP is electrically connected to the chip 32 via the through electrode 16b, the internal wiring 14b, the through electrode 16a, the surface wiring 14a, the capacitor C2, the surface wiring 14a, and the wire 18 (bonding wire). One differential output terminal OUTP is electrically connected to the chip 32 via the through electrode 16b, the internal wiring 14b, the through electrode 16a, the surface wiring 14a, the capacitor C1, the surface wiring 14a, and the wire 18 (bonding wire). In a case where the through electrodes 16b and 16a are overlapped with each other at the same position, the through electrodes 16b and 16a may be directly connected to each other without interposing the internal wiring 14b.

As illustrated in FIG. 8B, the coil 36 corresponding to the inductor L and the ferrite bead chip 38 corresponding to the ferrite bead F are mounted on the printed circuit board 10. The bias terminal Bias is electrically coupled to the surface wiring 14a corresponding to the output node N via the through electrode 16b, the internal wiring 14b, the through electrode 16a, the surface wiring 14a, the ferrite bead F, the surface wiring 14a, the wire 18 (one lead 42b of the coil 36), the coil 36, and the wire 18 (the other lead 42a of the coil 36). When the coil 36 and the ferrite bead chip 38 are mounted near the output node N, the internal wiring 14b between the ferrite bead chip 38 and the bias terminal Bias becomes longer. Such a longer internal wiring causes a larger parasitic capacitance Cf to be described. By reducing the parasitic capacitance Cf, a deterioration in high-speed performance of the driving circuit 30 can be suppressed.

Figure 9:
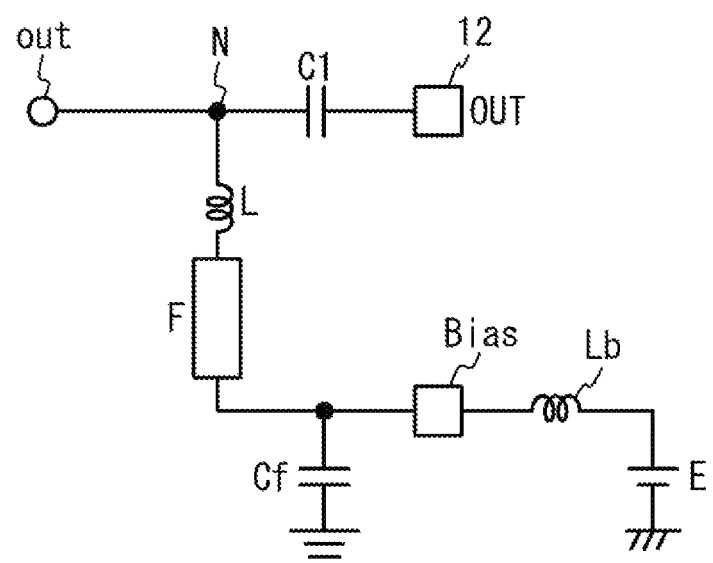
FIG. 9 is a circuit diagram of a bias circuit according to the first embodiment.

FIG. 9 is a circuit diagram of the bias circuit according to the first embodiment of the present invention.

In FIG. 9, an output of the driving circuit 30 is illustrated as an output end out, and the output terminals OUTP and OUTN are illustrated as an output terminal OUT. The bias circuit is provided for each of the two components of the differential output signals (positive phase component and negative phase component). The two bias circuits have the same configuration. In FIG. 9, an equivalent circuit of one bias circuit is illustrated, descriptions are also made for only one bias circuit, and repeated descriptions for another bias circuit will be omitted.

As illustrated in FIG. 9, the parasitic capacitance Cf is formed between the ground and a wiring which is positioned between the bias terminal Bias and the series circuit configured with the inductor L and the ferrite bead F.

As illustrated in FIG. 7, the parasitic capacitance Cf includes, for example, a capacitance generated between a ground layer of the printed circuit board 10 and the internal wiring (second conductive line) 14b which connects the coil 36 to the bias terminal Bias, a capacitance generated between a power supply layer of the printed circuit board 10 and the internal wiring 14b, and a capacitance generated between the internal wiring 14b and an adjacent wiring (another internal wiring). In the bias T, in order to reduce the parasitic capacitance between the output node N and the coil 36, the coil 36 is mounted as close as possible to the output node N. As a result, a shorter distance from the output node N to one wire 18 of the coil 36 connected to the output node N causes a longer distance from the ferrite bead 38 to the bias terminal Bias. Thus, the parasitic capacitance Cf is inevitably generated. As will be described later, in a case where the coil 36 is directly connected to the bias terminal Bias without passing through the ferrite bead 38, the parasitic capacitance Cf may resonate with the inductor L of the coil 36 and thus cause a dip (loss) in the pass characteristic from the output end out of the driving circuit 30 to the output terminal OUT, particularly in the resonance frequency. Therefore, it is preferable to reduce the parasitic capacitance Cf.

For this reason, as illustrated in FIG. 9, the ferrite bead F is inserted between the inductor (coil) L and the parasitic capacitance Cf. The ferrite bead F has unique resistive component which is approximately 0 Ω to several Q at a low frequency, but becomes 100 Ω or more at several hundred MHz. Thus, at the resonance frequency according to the inductor L and the parasitic capacitance Cf, the ferrite bead F acts like a resistor. Therefore, the ferrite bead F relaxes the resonance caused by the parasitic capacitance Cf and the inductor (coil) L.

Next, a comparative example 1 for comparison with the first embodiment of the present invention will be described.

FIG. 1 is a circuit diagram of an amplifier 901 according to a comparative example 1. The amplifier 901 according to the comparative example 1 is formed on the printed circuit board 100. The amplifier 901 according to the comparative example 1 is different from the amplifier circuit 1 according to the first embodiment of the present invention in that the ferrite bead F illustrated in FIG. 6 is not included and the inductor L is directly connected to the bias terminal Bias without passing through the ferrite bead F. Namely, the circuit configuration of the amplifier 901 is that of the first embodiment illustrated in FIG. 6 except the ferrite bead F. In the following, duplicate descriptions thereof will be omitted.

Figure 2:
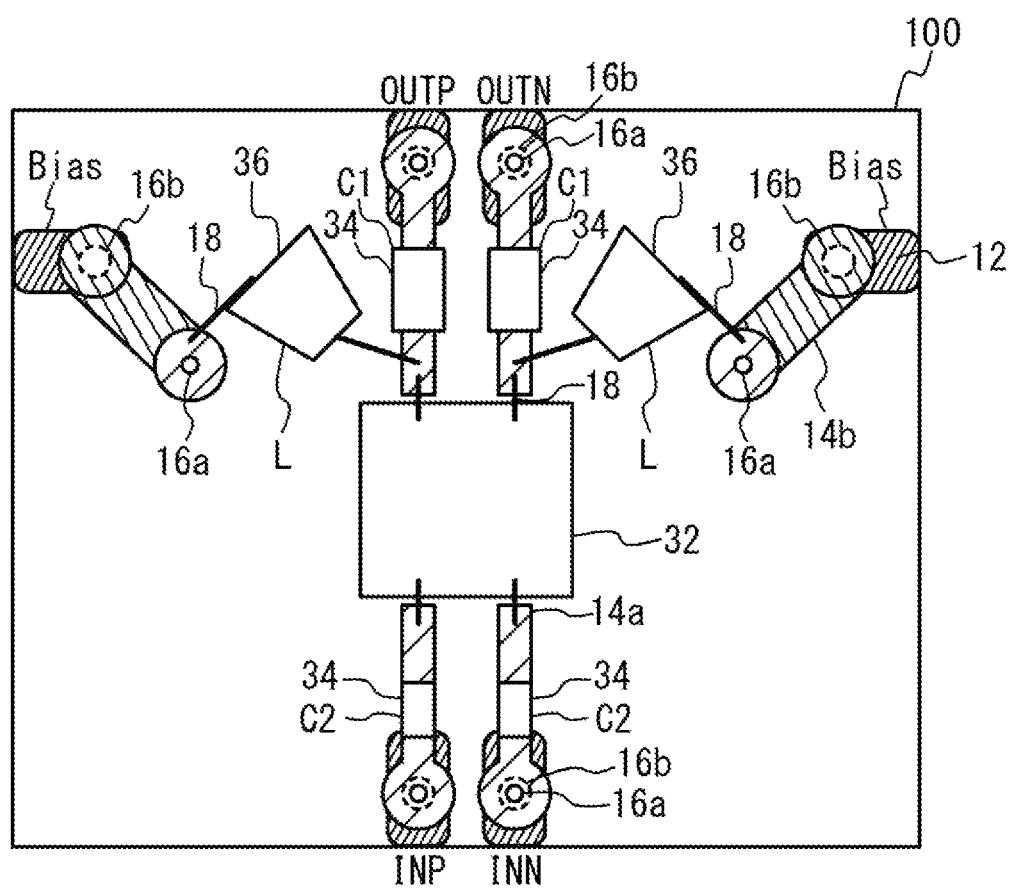
FIG. 2 is a plan view of a printed circuit board on which the amplifier according to the comparative example 1 is mounted.

FIG. 2 is a plan view of the printed circuit board 100. The amplifier 901 according to the comparative example 1 is mounted on the printed circuit board 100. The power supply terminal VCC, the ground, and wirings connected to the power supply terminal and the ground may be included but not illustrated. As illustrated in FIG. 2, the printed circuit board 100 according to the comparative example 1 is different from the printed circuit board 10 according to the first embodiment in that the ferrite bead 38 of FIG. 7 is not included and the coil 36 is connected to the through electrode 16a without passing through the ferrite bead 38. The circuit configuration is the same as that of the first embodiment illustrated in FIG. 7, and descriptions thereof will be omitted.

Figure 4:
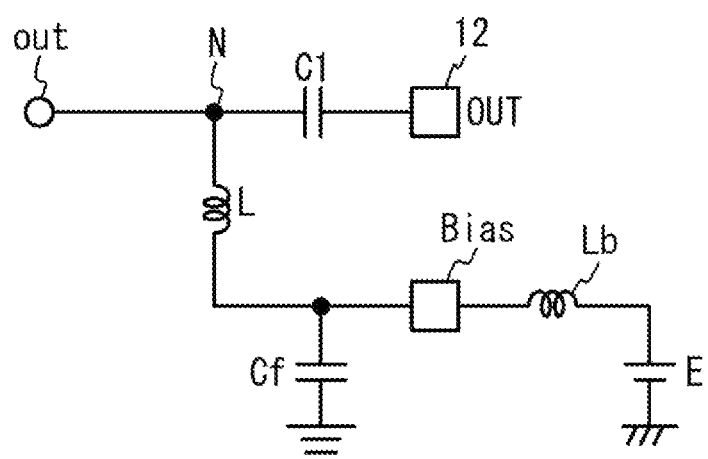
FIG. 4 is a circuit diagram of a bias circuit according to the comparative example 1.

FIG. 4 is an equivalent circuit diagram of the bias circuit according to the comparative example 1. The bias circuit of FIG. 4 is different from the bias circuit of FIG. 9 according to the first embodiment of the present invention in that the ferrite bead is not included and the inductor L is directly connected to the bias terminal Bias without passing through the ferrite bead. The circuit configuration is identical to that of the first embodiment illustrated in FIG. 9 except the ferrite bead F, and duplicate descriptions thereof will be omitted.

The resonance frequency Fosc according to the inductor L and the parasitic capacitance Cf is expressed by the following equation.

$$Fosc=1/(2\times\pi\times\sqrt{(L\times Cf)})$$

The inductor L and the parasitic capacitance Cf constitute a series circuit which is connected between the output node N and the ground. In the resonance frequency Fosc, the impedance of the series circuit becomes zero. Thus, a signal having the resonance frequency Fosc flows from the output node N to the ground. As a result, a large dip occurs in the signal transmission characteristic (pass characteristic) to be described. Assuming that the inductance of the inductor L is 70 nH and the parasitic capacitance Cf is 1 pF, the resonance frequency Fosc is, for example, 600 MHz.

A circuit simulation result of the pass characteristic S21 from the output end out to the output terminal OUT in FIG. 4 will be described. In the circuit simulation, as illustrated in FIG. 4, it is assumed that the bias terminal Bias is connected to a bias power supply E via a low-frequency cutoff inductor Lb outside the printed circuit board 100. Conditions used in the circuit simulation (circuit constants) are described below. Although the resistance component in series (ESR) which is parasitic on the inductor (coil) is omitted in FIG. 4, the resistance component in series is connected to the inductance in series.

Inductance of inductor L: 70 nH
Resistance component in series of inductor L (ESR): 0.3Ω
Capacitance of capacitor C1: 100 nF
Parasitic capacitance Cf: 1 pF
Inductance of inductor Lb: 10 μh
Resistance component in series of inductor Lb (ESR): 0.5Ω

Figure 5:
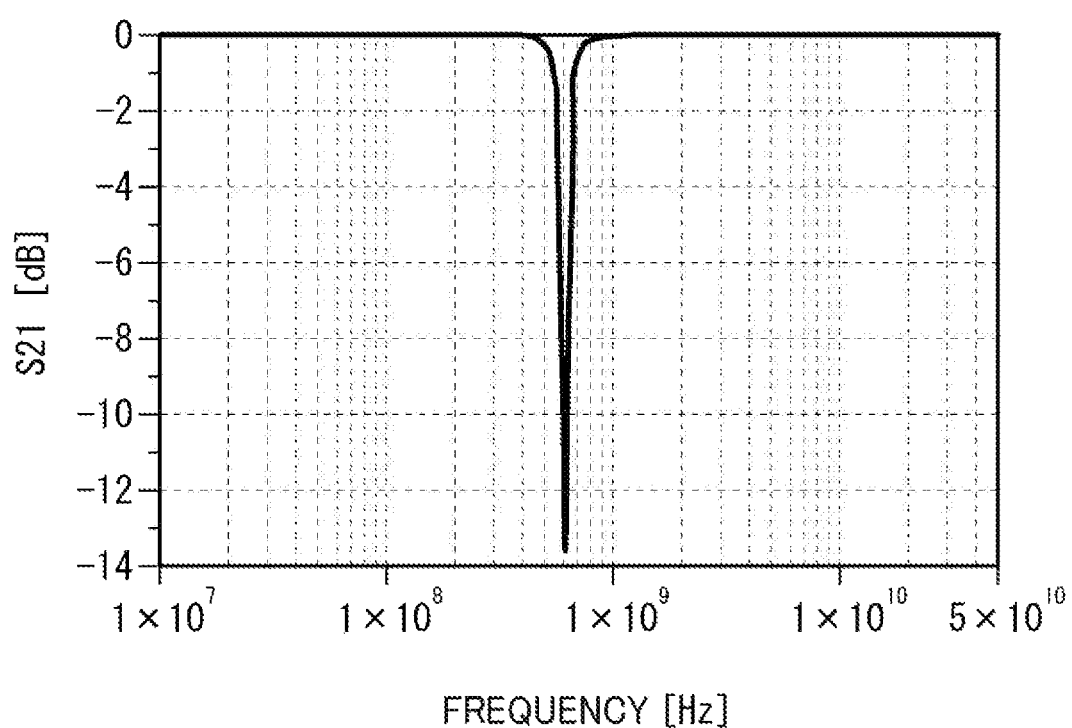
FIG. 5 is a graph illustrating a signal pass characteristic from an output end of a driving circuit to an output terminal of the printed circuit board according to the comparative example 1.

FIG. 5 is a graph illustrating the pass characteristic from the output end out of the driving circuit to the output terminal OUTP (or OUTN) according to the comparative example 1. A horizontal axis of the pass characteristic represents a frequency of a signal, and a vertical axis of the pass characteristic represents a loss of the signal at the corresponding frequency. As illustrated in FIG. 5, a steep dip (decrease) occurs at the vicinity of 600 MHz. For example, in a driving circuit for an optical transmitter, it is required that a magnitude of the dip is 2 dB or less. The result illustrated in FIG. 5 does not satisfy the requirement. In addition, for example, in a case of a driver IC including a multi-channel driving circuit that drives a plurality of laser diodes in parallel, it is required that a deviation (SDD21) among channels is 1 dB or less. Since the frequency at which the dip occurs depends on a magnitude of the parasitic capacitance, when the frequencies at each of which the dip occurs differ from each other between the channels, the deviation among the channels may not satisfy the requirement.

Next, a circuit simulation result of the pass characteristic S21 from the output end out to the output terminal OUT in FIG. 9 according to the first embodiment will be described. As the ferrite bead F, a ferrite bead having a characteristic of BLM03HD471SN1 manufactured by Murata Manufacturing Co., Ltd. is used. Impedance of the ferrite bead F is set to 900 Ω at the vicinity of 600 MHz. A capacitance of respective pads for mounting the chip capacitor 34, the coil 36, and the ferrite bead chip 38 is set to 50 fF. Each pad is a part of the surface wiring 14a. The other simulation conditions are the same as in the comparative example 1.

Figure 10A:
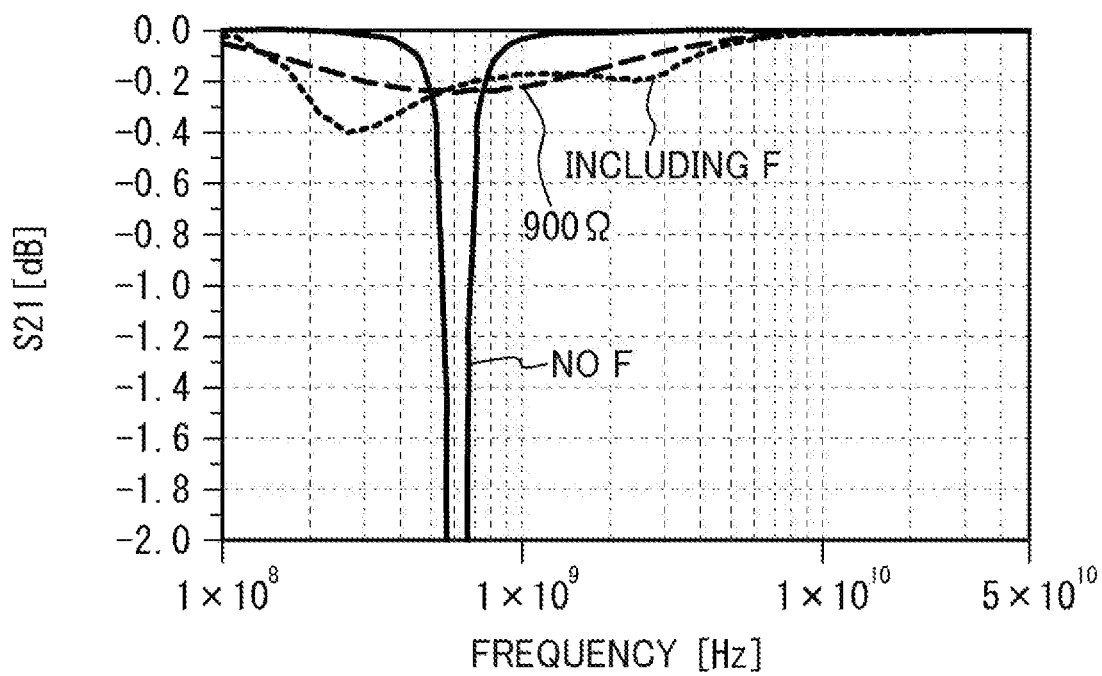
FIG. 10A is a graph illustrating a signal pass characteristic from an output end of the driving circuit to an output terminal of the printed circuit board according to the first embodiment.
Figure 10B:
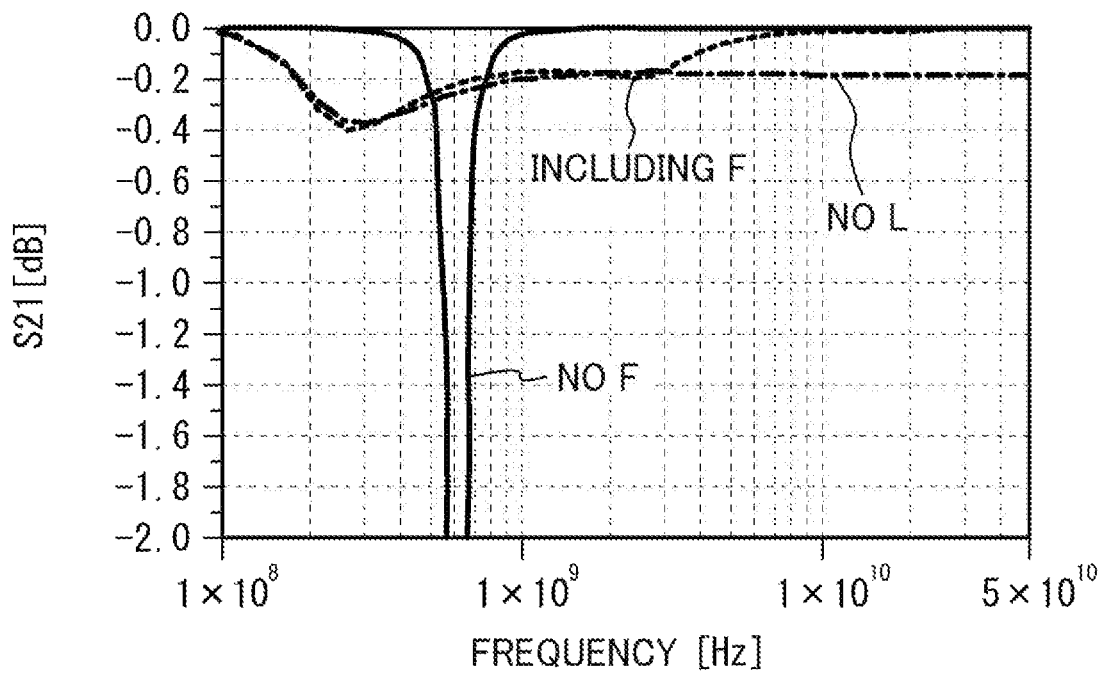
FIG. 10B is a graph illustrating a signal pass characteristic from an output end of the driving circuit to an output terminal of the printed circuit board according to the first embodiment.

FIG. 10A and FIG. 10B are graphs illustrating the pass characteristic from the output end out of the driving circuit to the output terminal OUT according to the first embodiment. In FIG. 10A and FIG. 10B, "Including F" is a circuit simulation result according to the first embodiment, "No F" is a circuit simulation result according to the comparative example 1. In FIG. 10A, "900 Ω" is a circuit simulation result in a case where a resistance element having a resistance value of 900 Ω is provided instead of the ferrite bead F. In FIG. 10B, "No L" is a circuit simulation result in a case where the ferrite bead F is provided and the inductor L is not provided.

As illustrated in FIG. 10A, in the first embodiment, a dip can be largely suppressed at the vicinity of 600 MHz as compared with the comparative example 1. When 0 dB is set as a reference, a magnitude (absolute value) of the dip is 1 dB or less. Even when a resistor having 900 Ω is provided instead of the ferrite bead F, the dip is suppressed to the same extent. In this manner, by inserting a resistance component having approximately 900 Ω at the vicinity of the resonance frequency between the inductor L and the parasitic capacitance Cf, a resonance phenomenon can be suppressed, and a dip in the pass characteristic can be suppressed. In the first embodiment, as compared to "900 Ω", a small dip occurs in addition 600 MHz. This is because the impedance of the ferrite bead F is different from a pure resistance.

When a resistive element is connected instead of the ferrite bead F, a dip is suppressed. On the other hand, a resistance component is connected between the bias terminal Bias and the node N. Thus, as a direct current flows, a voltage drop occurs, and a potential of the output node N drops below the bias voltage. In the first embodiment, since the ferrite bead F is connected, the resistance component is small even when a direct current flows. Thus, a drop in the potential of the node N can be reduced.

As in "No L" of FIG. 10B, in a case where the ferrite bead F is provided between the output node N and the bias terminal Bias without providing the coil 36, a loss increases at a high frequency. This is because the impedance of the ferrite bead F decreases at a high frequency. In this manner, by providing the coil 36 between the output node N and the ferrite bead F, the impedance at a high frequency increases, and thus a deterioration in the pass characteristic can be suppressed. In a case where a plurality of coils having different cutoff frequencies are combined with each other, conventionally, a coil (for example, a winding coil) having a low cutoff frequency is disposed outside a coil (for example, a chip inductor) having a high cutoff frequency.

On the other hand, in the printed circuit board 10 on which the driving circuit illustrated in FIG. 7 according to the first embodiment of the present invention is mounted, in order to solve the problem, the inventor found out that it is preferable to dispose the conical coil 36a on the output node N side, and dispose the ferrite bead F relatively closer to the bias terminal Bias than the conical coil 36a.

According to the first embodiment, the ferrite bead F is provided on the top surface of the printed circuit board 10, and is connected in series with the coil 36 between the coil 36 and the bias terminal Bias. That is, in the series circuit configured with the inductor L (coil 36) and the ferrite bead F, the inductor L is electrically connected to the output end out, and the ferrite bead F (ferrite bead element) is electrically connected to the bias terminal Bias. The resonance phenomenon (LC resonance) between the coil 36 and the parasitic capacitance Cf is reduced by the ferrite bead F, and thus a dip in the pass characteristic from the output of the driving circuit 30 to the output terminal can be reduced. Further, since the impedance of the coil 36 increases at a high frequency, it is possible to suppress a loss from the output of the driving circuit 30 to the output terminal at a high frequency higher than the resonance frequency.

In addition, as illustrated in FIG. 8B, the internal wiring 14b which connects the ferrite bead F to the bias terminal Bias is provided inside the printed circuit board 10. The bias terminal Bias is provided so as to face the outside of the package, for a connection with an external circuit. Thus, the bias terminal Bias and the coil 36 are connected to each other via the internal wiring 14b. In this manner, when the coil 36 is connected to the bias terminal Bias via the internal wiring 14b, the parasitic capacitance Cf is likely to increase. Therefore, in order to suppress the LC resonance, it is preferable to provide the ferrite bead F. In addition, when a parasitic capacitance is generated between the coil 36 and the ferrite bead F, the generated parasitic capacitance acts in the same manner as the parasitic capacitance Cf. Thus, it is preferable to connect the coil 36 and the ferrite bead F by using the surface wiring 14a as short as possible.

The printed circuit board 10 includes a plurality of insulating layers 10a and 10b, and the internal wiring 14b is provided between the plurality of insulating layers 10a and 10b. In this case, the parasitic capacitance Cf having a large magnitude is added to the internal wiring 14b. Therefore, in order to suppress the LC resonance, it is preferable to provide the ferrite bead F.

Preferably, the coil 36 is a conical coil, which enables to increase the impedance of the coil 36 at a high frequency.

In addition, the ferrite bead F is a chip component for surface mounting. Thereby, it is possible to mount the ferrite bead F on the printed circuit board 10. Further, the ferrite bead F is disposed as close as possible to the coil 36, and thus, as described above, it is possible to connect the coil 36 and the ferrite bead F by using the short surface wirings 14a.

As illustrated in FIG. 7, the printed circuit board 10 includes wiring paths L1 and L2. The wiring path L1 (first wiring path) connects the output of the driving circuit chip 32 to the lead of the inductor L (lead 42a in FIG. 3, first lead). The first lead has an end (first end of the inductor L) to be soldered for mounting. The wiring path L2 (second wiring path) couples the lead of the inductor L (lead 42b in FIG. 3, second lead) to the bias terminal Bias. The second lead has an end (second send of the inductor L) to be soldered for mounting. The wiring path L2 includes the ferrite bead F. A length of the wiring path L1 is shorter than a length of the wiring path L2. Thereby, a parasitic capacitance generated in the wiring path L1 can be reduced compared with a parasitic capacitance generated in the wiring path L2.

Further, wiring paths L3 and L4 are provided in the wiring path L2. The wiring path L3 (third wiring path) connects the second lead of the inductor L and one end (first end) of the ferrite bead F. The wiring path L4 (fourth wiring path) connects the other end (second end) of the ferrite bead F to the bias terminal Bias. A length of the wiring path L3 is shorter than a length of the wiring path L4. Thereby, a parasitic capacitance generated in the wiring path L3 can be reduced compared with a parasitic capacitance generated in the wiring path L4, and a parasitic capacitance generated on the inductor L side of one end of the ferrite bead F can be reduced. Thus, a resonance phenomenon can be mitigated.

Further, the printed circuit board 10 includes the surface wiring (first conductive layer) 14a formed on the mounting surface and the internal wiring (second conductive layer) 14b formed inside the printed circuit board 10. The wiring paths L1 and L3 include the surface wiring 14a, and the wiring path L4 includes the internal wiring 14b. When the wiring path L4 includes the internal wiring 14b, the parasitic capacitance Cf increases. Therefore, the ferrite bead F disposed between the coil 36 and the bias terminal Bias has an advantage to suppress the LC resonance.

Modification Example 1 of First Embodiment

Figure 11:
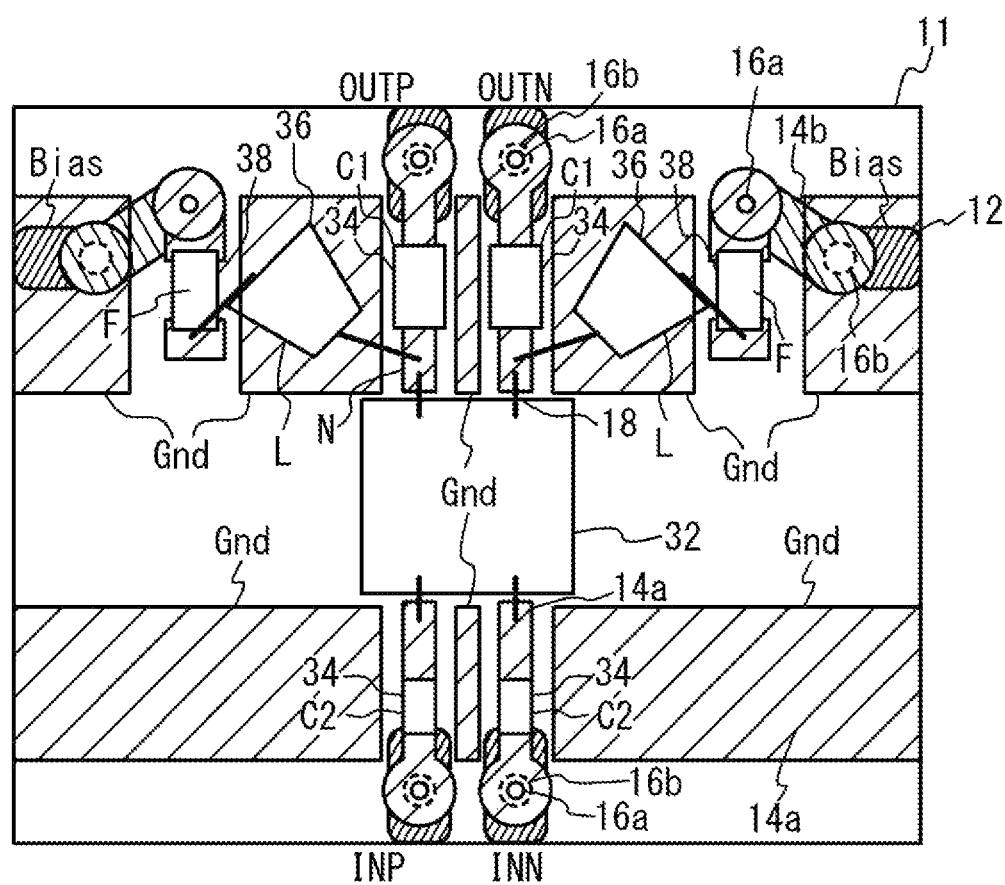
FIG. 11 is a plan view of the printed circuit board on which the amplifier according to a modification example 1 of the first embodiment is mounted.

FIG. 11 is a plan view of the printed circuit board on which the amplifier according to a modification example 1 of the first embodiment is mounted.

As illustrated in FIG. 11, on the printed circuit board 10, ground patterns Gnd are provided on both sides of the surface wiring 14a through which a signal is transmitted. A coplanar line can be formed by the surface wiring 14a through which a signal is transmitted and the ground pattern Gnd. The configuration is the same as that of the first embodiment except the ground patterns Gnd, and duplicate descriptions thereof will be omitted.

Second Embodiment

Figure 12:
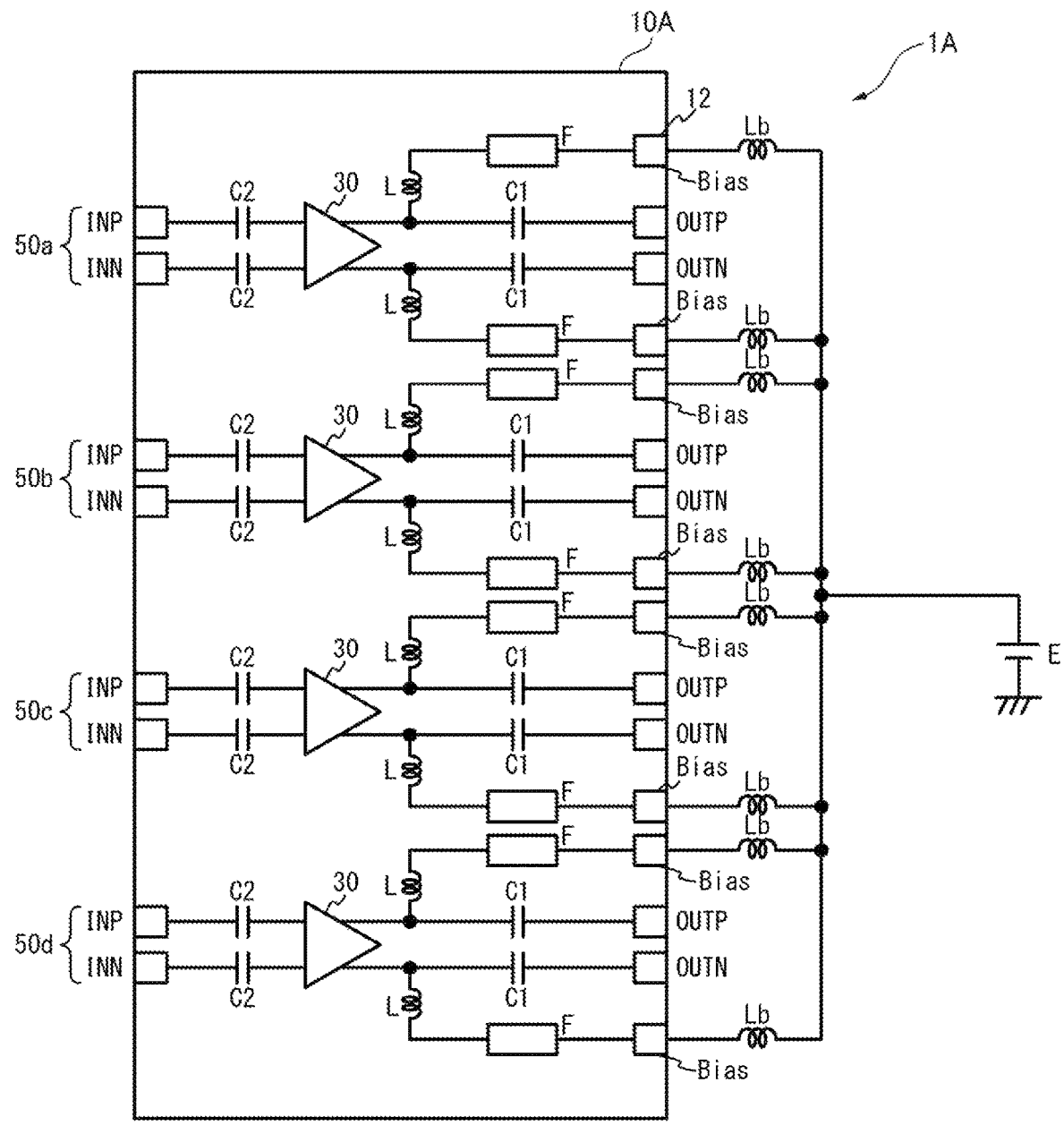
FIG. 12 is a circuit diagram of the amplifier according to a second embodiment.

A second embodiment is an embodiment in which the amplifier for a four-channel optical transmitter is provided. FIG. 12 is a circuit diagram of the amplifier 1A according to the second embodiment. As illustrated in FIG. 12, four channels 50a to 50d are provided in parallel. As in the first embodiment, each of the channels 50a to 50d includes a driving circuit 30, capacitors C1 and C2, inductors L, ferrite beads F, input terminals INP and INN, output terminals OUTP and OUTN, and bias terminals Bias. Each bias terminal Bias is connected to a bias power supply E after being commonly connected via the inductor Lb outside the printed circuit board 10A. The inductor Lb is an inductor for improving isolation (separation between signals) between the bias terminals Bias. The four channels 50a to 50d are used for, for example, polarization multiplex quadrature phase modulation such as dual polarization (DP)-quadrature phase shift keying (QPSK) or DP-16 quadrature amplitude modulation (QAM). For example, the four channels correspond to two polarizations of X and Y and a combination of an I phase and a Q phase of a complex plane (X-I, X-Q, Y-I, and Y-Q).

Figure 13:
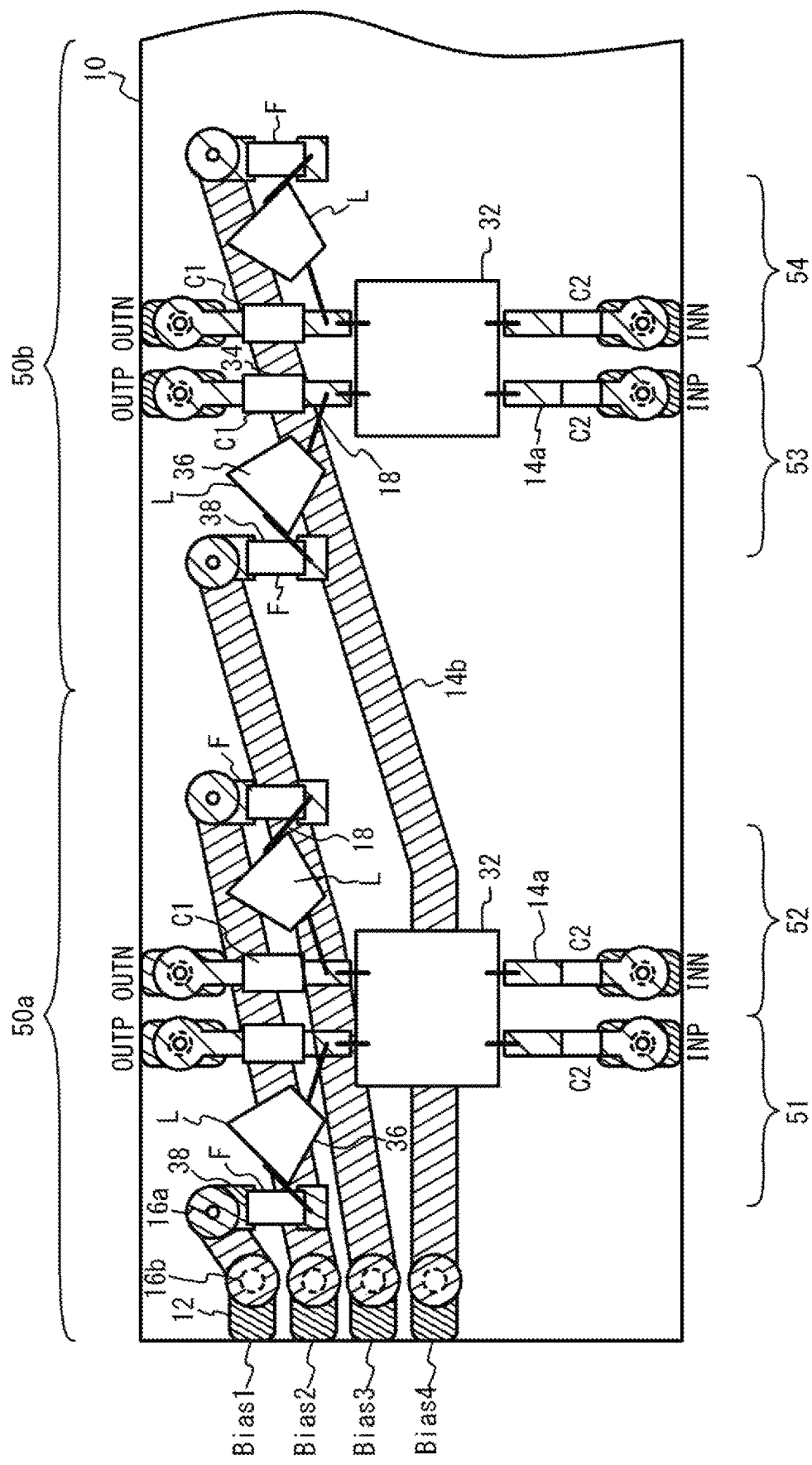
FIG. 13 is a plan view of the printed circuit board on which the amplifier having two channels according to the second embodiment is mounted.

FIG. 13 is a plan view in which two adjacent channels according to the second embodiment are mounted. As illustrated in FIG. 13, among the four channels in FIG. 12, two channels 50a and 50b are illustrated. The bias terminals Bias1 to Bias4 are provided on the outermost side of the channel 50a. Although a right side of the channel 50b is not illustrated, the channels 50c and 50d are respectively disposed lateral-symmetrically with the channels 50b and 50a, with a symmetry axis as a center line (not illustrated) between the channels 50b and 50c. It is assumed that paths of the differential signals from the input terminal INP or INN to the output terminal OUTP or OUTN are paths 51 to 54. The paths 51 to 54 are provided with respective distances from the bias terminals Bias1 to Bias4. A length of the internal wiring 14*b* which connects each of the bias terminals Bias1 to Bias4 to each of the paths 51 to 54, increases in accordance with the paths 51 to 54.

In this manner, when the internal wiring 14*b* becomes longer in accordance with the paths 51 to 54, the parasitic capacitance Cf increases in accordance with the length of the internal wiring 14*b*. In an actual pattern, preferably, the internal wiring 14*b* does not overlap with the chip 32, the chip capacitor 34, the coil 36, and the ferrite bead chip 38 vertically (in a direction perpendicular to the paper surface). When the internal wiring 14*b* are formed around the components so as not to overlap with them, the length of the internal wiring 14*b* becomes longer than that in FIG. 13, and a difference between the channels in the length of the internal wiring 14*b* also increases.

In the second embodiment, for the paths 51 to 54, the pass characteristics S21 from the input terminal INP or INN to the output terminal OUTP or OUTN were measured. For a comparative example 2 in which the same structure as that of the second embodiment is adopted and the ferrite bead F is not included, the pass characteristics were also measured. In the comparative example 2, as a non-limiting example of the ferrite bead, BLM15HG601SN1D manufactured by Murata Manufacturing Co., Ltd. was connected between the bias terminal Bias and the inductor Lb. In the second embodiment, as the ferrite bead, BLM03HD102SN1 manufactured by Murata Manufacturing Co., Ltd. was connected between the bias terminal Bias and the inductor Lb. The inductance of the inductor Lb is 10 μH. Other configurations of the comparative example 2 and the second embodiment are the same as the comparative example 1 and the first embodiment, respectively.

Figure 14A:
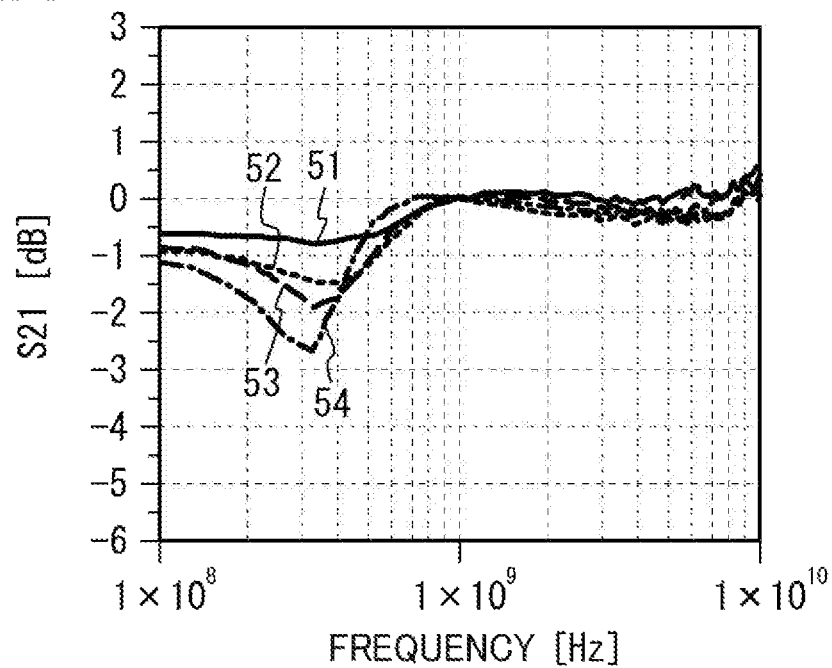
FIG. 14A is a graph illustrating a signal pass characteristic from an output end of the driving circuit to an output terminal of the printed circuit board.
Figure 14B:
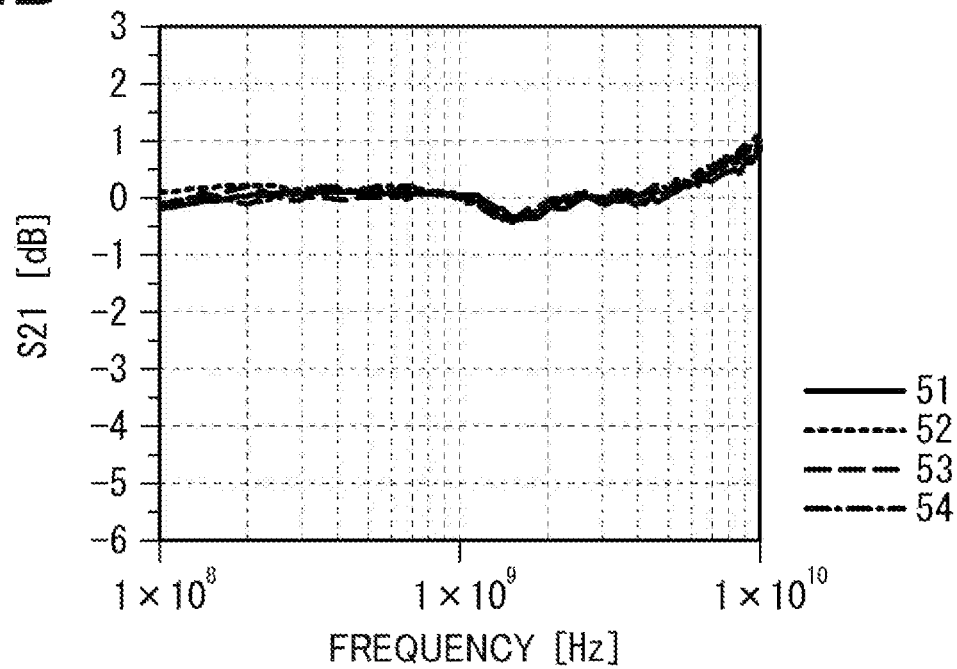
FIG. 14B is a graph illustrating a signal pass characteristic from an output end of the driving circuit to an output terminal of the printed circuit board.

FIG. 14A is a graph illustrating the pass characteristics according to the comparative example 2 from the input terminal to the output terminal FIG. 14B is a graph illustrating the pass characteristics according to the second embodiment from input terminal to the output terminal.

In FIG. 14A and FIG. 14B, the length of the internal wiring 14*b* increases in order of the paths 51 to 54.

As illustrated in FIG. 14A, in the comparative example 2, as the internal wiring 14*b* become longer according to the paths 51 to 54, a larger dip occurs, and a frequency of the dip (the resonance frequency) moves to a low frequency side. This is because the parasitic capacitance Cf increases as the length of the internal wiring 14*b* increases. In the paths 51 to 54, the magnitude of the dip is approximately 1 dB to 2.5 dB, which does not satisfy the required performance of 2 dB or less. For example, a curve of the channel 50*d* is less than −2 dB at the vicinity of 300 MHz. In addition, a deviation between the channels is approximately 2 dB, which does not satisfy the required performance of 1 dB or less.

As illustrated in FIG. 14B, in the second embodiment, the pass characteristics in the paths 51 to 54 are substantially the same. It is considered that the dip of approximately 0.5 dB at the vicinity of 1.5 GHz is caused by the parasitic capacitance (approximately 160 fF) of the surface wiring 14*a* for the ferrite bead F. In the second embodiment, the magnitude of the dip is 2 dB or less, and the deviation between the paths 51 to 54 is 1 dB or less. Thus, both of the states satisfy the required performance.

According to the second embodiment, each of the plurality of capacitors C1 is connected between each of the plurality of output ends of the driving circuits 30 and each of the plurality of output terminals OUTP and OUTN. Each of the plurality of coils 36 is connected between each of the output nodes N and each of the plurality of the bias terminals Bias, the output nodes N being positioned between each of the plurality of outputs of the driving circuits 30 and each of the plurality of capacitors C1. Each of the plurality of ferrite beads F is connected between each of the plurality of coils 36 and each of the plurality of bias terminals Bias. Thereby, it is possible to suppress the deviation between the channels in the pass characteristic.

In addition, in a case where the lengths of the plurality of internal wirings 14*b* which connect the plurality of ferrite beads F to the plurality of bias terminals Bias are different from each other, in the comparative example 2, the deviation between the channels in the pass characteristic is large. In the second embodiment, even when the lengths of the internal wirings 14*b* are different from each other, it is possible to suppress the deviation between the channels in the pass characteristic.

Each of the plurality of bias terminals Bias is connected to a bias voltage via each of the plurality of inductors Lb (second inductors). Setting the inductance of the inductor Lb larger than the inductance of the inductor L (first inductor) of the coil 36 mounted on the printed circuit board 10 allows the isolation between the bias terminals Bias to be improved.

Third Embodiment

Figure 15:
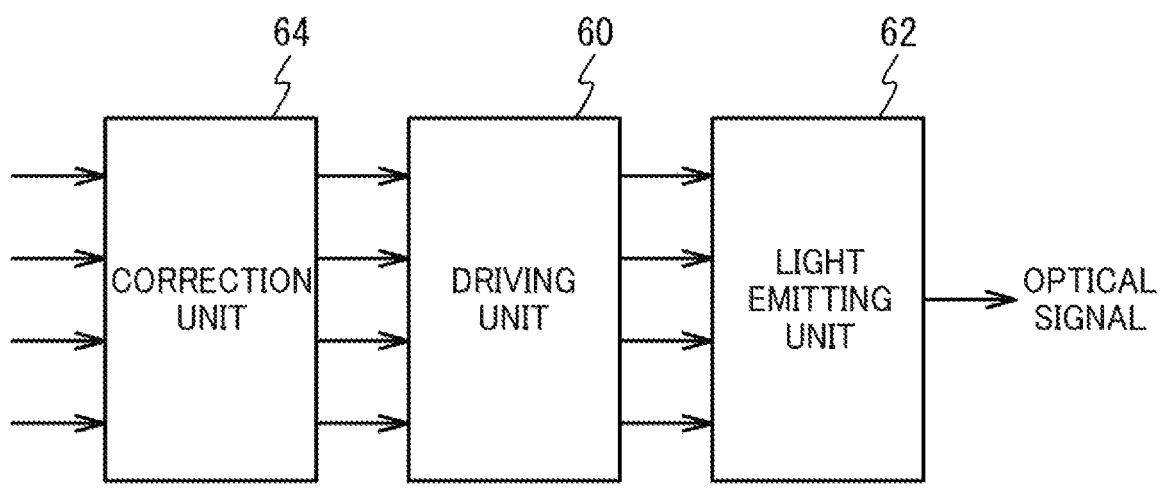
FIG. 15 is a block diagram of an optical transmitter according to a third embodiment.

FIG. 15 is a block diagram of an optical transmitter according to a third embodiment. As illustrated in FIG. 15, the optical transmitter includes a driving unit 60, a light emitting unit 62, and a correction unit 64. The driving unit 60 is the amplifier according to the second embodiment.

The correction unit 64 is, for example, a clock data recovery (CDR) integrated circuit, and retimes and reshapes each of four-channel electric signals. As the correction of the electric signals, for example, waveform shaping and timing reproducing are performed. The driving unit 60 drives a plurality of light emitting elements (for example, laser diodes) in the light emitting unit 62 or the optical modulators by amplifying the four-channel electric signals corrected by the correction unit 64. The light emitting unit 62 outputs, for example, a multi-level modulation signal such as DP-QPSK or DP-16QAM from the optical signal emitted from the light emitting element.

According to the third embodiment, the amplifier according to the second embodiment used for the driving unit 60 mitigates the resonance phenomenon caused by the coil and the parasitic capacitance of the driving unit 60.

The embodiments disclosed herein have been presented by way of example only, and are not intended to limit the scope of the present invention. The scope of the present invention is defined by the spirit of the claims rather than the description described above, and is intended to include equivalents of the claims and modifications within the spirit of the claims.

What is claimed is:

1. An amplifier comprising:
   a printed circuit board (PCB) having a component side and a solder side and including an output terminal and a bias terminal, the output terminal being configured to output an electrical signal to an outside, the bias terminal being configured to receive a bias of the electrical signal from the outside;
   an integrated circuit (IC) mounted on the component side of the PCB, and including a driving circuit and an output end, the driving circuit being configured to generate the electrical signal, and the output end being configured to output the electrical signal generated by the driving circuit;

a capacitor mounted on the component side of the PCB and electrically connected between the output end of the IC and the output terminal of the PCB; and a series circuit mounted on the component side of the PCB, and including an inductor and a ferrite bead element connected to each other in series, the inductor having a first end and a second end, the ferrite bead element having a first end and a second end, the first end of the inductor being electrically coupled to the output end of the IC, the second end of the ferrite bead element being electrically coupled to the bias terminal of the PCB, and the second end of the inductor being electrically coupled to the first end of the ferrite bead element.

2. The amplifier according to claim 1, wherein the inductor is a conical coil including a coil portion, a first lead, and a second lead, the coil portion including a first winding portion having a first diameter and a second winding portion having a second diameter that is greater than the first diameter, the first lead being electrically connected to the first winding portion of the coil portion, and the second lead being electrically connected to the second winding portion of the coil portion, and wherein the PCB further includes a first wiring path having a first length for electrically coupling the output end to the first lead of the inductor and a second wiring path having a second length for electrically coupling the second lead of the inductor to the bias terminal, the first length of the first wiring path being shorter than the second length of the second wiring path.

3. The amplifier according to claim 2, wherein the second end of the ferrite bead element is mounted on the second wiring path, and wherein the PCB further includes a third wiring path having a third length for electrically coupling the second lead of the inductor to the first end of the ferrite bead element and a fourth wiring path having a fourth length for electrically coupling the second end of the ferrite bead element to the bias terminal, the third length of the third wiring path being shorter than the fourth length of the fourth wiring path.

4. The amplifier according to claim 3, wherein the bias terminal is formed on the solder side of the PCB, and wherein the PCB further includes a first conductive layer formed on the component side of the PCB and a second conductive layer formed inside the PCB, and the first wiring path and the third wiring path include a line of the first conductive layer, and the second wiring path includes a line of the second conductive layer.

5. An amplifier comprising:

a printed circuit board (PCB) including a plurality of output terminals and a plurality of bias terminals;

an integrated circuit (IC) mounted on the PCB, the IC including a plurality of output ends;

a plurality of capacitors mounted on the PCB with each capacitor connected between one of the output ends and one of the output terminals;

a plurality of series circuits mounted on the PCB, each series circuit including a first inductor and a ferrite bead element connected to each other in series, each first inductor being electrically connected to one of the output ends, and each ferrite bead element being electrically connected to one of the bias terminals, and a plurality of second inductors each having a first end and a second end, the first end of each of the second inductors being electrically connected to one of the bias terminals, and the second end of each of the second inductors being commonly connected to a bias voltage.

6. The amplifier according to claim 5, wherein the PCB includes a plurality of first wiring paths with each first wiring path connecting one of the output ends of the IC to one of the first inductors, and a plurality of second wiring paths with each second wiring path connecting one of the first inductors to one of the bias terminals, a length of each first wiring path being shorter than a length of each second wiring path.

7. An optical transmitter comprising:

the amplifier according to claim 1.

* * * * *